(12) United States Patent
Nagatomo et al.

(10) Patent No.: US 12,500,107 B2
(45) Date of Patent: Dec. 16, 2025

(54) MOUNTING DEVICE AND MOUNTING METHOD

(71) Applicant: SAMSUNG ELECTRONICS CO., LTD., Suwon-si (KR)

(72) Inventors: Daisuke Nagatomo, Kanagawa (JP); Fumitaka Moroishi, Kanagawa (JP); Masanori Izumita, Kanagawa (JP); Shinji Ueyama, Kanagawa (JP); Takahiro Tokumiya, Kanagawa (JP); Takamasa Sugiura, Kanagawa (JP); Tatsuya Ishimoto, Kanagawa (JP); Masato Kajinami, Kanagawa (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 459 days.

(21) Appl. No.: 18/078,249

(22) Filed: Dec. 9, 2022

(65) Prior Publication Data

US 2023/0187249 A1    Jun. 15, 2023

(30) Foreign Application Priority Data

Dec. 13, 2021    (JP) ................... 2021-201446

(51) Int. Cl.
*H01L 21/68*    (2006.01)
*G06T 7/00*    (2017.01)
(Continued)

(52) U.S. Cl.
CPC .......... *H01L 21/681* (2013.01); *G06T 7/0004* (2013.01); *H01L 21/67259* (2013.01);
(Continued)

(58) Field of Classification Search
CPC ............ H01L 21/681; H01L 21/67259; H01L 23/544; H01L 2223/54426; G06T 7/0004; G06T 2207/30148
See application file for complete search history.

(56) References Cited

U.S. PATENT DOCUMENTS 5,225,026 A    7/1993 Ozawa et al.
2005/0274869 A1    12/2005 Yamauchi et al.

FOREIGN PATENT DOCUMENTS

JP    4-206746 A    7/1992
JP    5-327290 A    12/1993
(Continued)

OTHER PUBLICATIONS

Office Action dated Apr. 1, 2025, issued by Japanese Patent Office in Japanese Patent Application No. 2021-201446.
(Continued)

*Primary Examiner* — Jamil Ahmed
(74) *Attorney, Agent, or Firm* — Sughrue Mion, PLLC

(57) ABSTRACT

A mounting device includes: a bonding head configured to hold a first object, a bonding stage configured to hold a second object, and a dual-field-of-view (FOV) optical system including an image sensor configured to simultaneously capture an image of a first alignment mark on the first object and an image of a second alignment mark on the second object to obtain a first image. At least one of the bonding head and the bonding stage is configured to adjust a relative position between the first object and the second object based on the first image, and bond the first object to the second object.

20 Claims, 8 Drawing Sheets

(51) Int. Cl.
   *H01L 21/67* (2006.01)
   *H01L 23/544* (2006.01)
(52) U.S. Cl.
   CPC .. *H01L 23/544* (2013.01); *G06T 2207/30148* (2013.01); *H01L 2223/54426* (2013.01)

(56) References Cited

FOREIGN PATENT DOCUMENTS

| | | | | |
|---|---|---|---|---|
| JP | 8-43057 | A | 2/1996 | |
| JP | 2003-142892 | A | 5/2003 | |
| JP | 2009-152478 | A | 7/2009 | |
| JP | 5876000 | B2 | 3/2016 | |
| JP | 2016-92094 | A | 5/2016 | |
| JP | 2016-219502 | A | 12/2016 | |
| JP | 2017-183451 | A | 10/2017 | |
| JP | 2017183628 | A * | 10/2017 | ............. H01L 24/75 |
| JP | 6478939 | B2 | 3/2019 | |
| JP | 2019-160933 | A | 9/2019 | |
| KR | 2007-306031 | A | 11/2007 | |
| KR | 10-2017-0112890 | A | 10/2017 | |
| KR | 2020-17574 | A | 1/2020 | |
| WO | 03/085723 | A1 | 10/2003 | |
| WO | 2020/022201 | A1 | 1/2020 | |

OTHER PUBLICATIONS

Communication issued on Oct. 7, 2025 by the Japan Patent Office in Japanese Patent Application No. 2021-201446.

\* cited by examiner

MOUNTING DEVICE AND MOUNTING METHOD

CROSS-REFERENCE TO RELATED APPLICATIONS

This application claims priority from Japanese Patent Application No. 2021-201446, filed on Dec. 13, 2021, in the Japanese Patent Office, the disclosure of which is incorporated herein in its entirety by reference.

BACKGROUND

1. Field

The embodiments of the disclosure relate to a mounting device and a mounting method.

2. Description of Related Art

In order to achieve low power consumption and a high driving speed, multilayering of semiconductor devices is progressing. A chip bonding process such as a chip-on-chip (CoC) or a chip-on-wafer (CoW) or a process of mounting a chip on a semiconductor package is changing from a wire bonding method to a flip chip or a through silicon via (TSV) method. In the wire bonding method, bonding precision of several tens of μm is enough. However, in the flip chip in which bumps are required to directly contact pads, precision of several μm is required. In particular, in chip bonding by the TSV, precision of sub-μm is required. In addition, because a metal structure is directly bonded in flip chip bonding, high temperature and pressure are required during bonding. In a high precision chip bonding device, fine mechanical and thermal changes in the device deteriorates mounting precision.

SUMMARY

The embodiment of the disclosure provide a mounting device capable of implementing high precision mounting and a mounting method using the same.

According to an aspect of the disclosure, there is provided a mounting device which may include: a bonding head configured to hold a first object, a bonding stage configured to hold a second object, and a dual-field-of-view (FOV) optical system including an image sensor configured to simultaneously capture an image of a first alignment mark on the first object and an image of a second alignment mark on the second object to obtain a first image. At least one of the bonding head and the bonding stage may be configured to adjust a relative position between the first object and the second object based on the first image, and bond the first object to the second object.

According to another aspect of the disclosure, there is provided a mounting method which may include: holding a first object by a bonding head; holding a second object by a bonding stage; simultaneously capturing an image of a first alignment mark on the first object and an image of a second alignment mark on the second object by an image sensor of a dual field-of-view (FOV) optical system to obtain a first image; adjusting a relative position between the first object and the second object by moving at least one of the bonding head and the bonding stage based on the first image; and bonding the first object to the second object.

According to an aspect of the disclosure, there is provided a mounting device which may include: a bonding head configured to hold a first object; a bonding stage configured to hold a second object; and a dual field-of-view (FOV) optical system including an optical device including an image sensor configured to capture an image of the first object and an image of the second object, wherein at least one of the bonding head and the bonding stage is configured to adjust a relative position between the first object and the second object based on the images of the first object and the second object, and at least one fiducial mark is formed in the optical device at a position where an image of the fiducial mark is always captured by the image sensor when the image sensor captures the images of the first object and the second object.

BRIEF DESCRIPTION OF DRAWINGS

The embodiments of the disclosure will be more clearly understood from the following detailed description taken in conjunction with the accompanying drawings in which.

DETAILED DESCRIPTION OF EMBODIMENTS

It will be also understood that, even if a certain step or operation of manufacturing, testing or measuring an apparatus or structure is described later than another step or operation, the step or operation may be performed later than the other step or operation unless the other step or operation is described as being performed after the step or operation. Further, functions, operations or steps described in a particular block may occur in a different way from a flow described in the flowchart. For example, two consecutive blocks may be performed simultaneously, or the blocks may be performed in reverse according to related functions, operations or steps.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
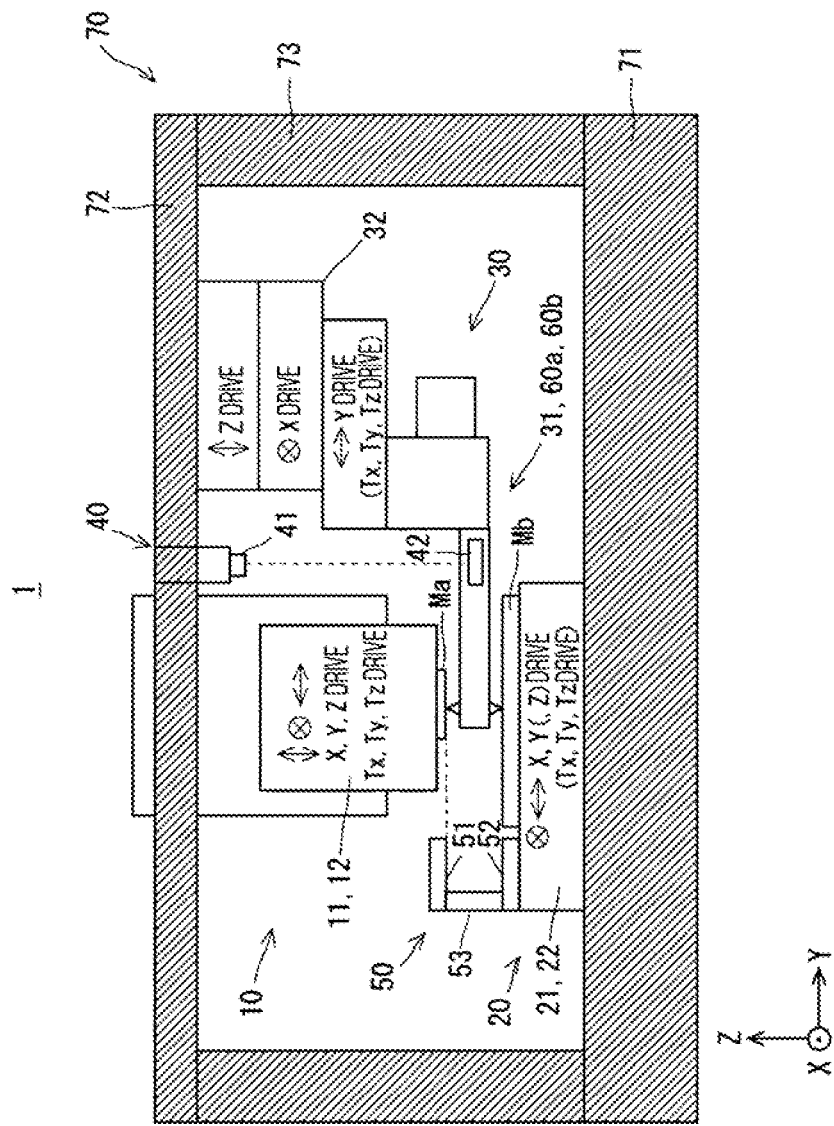
FIG. 1 is a block diagram illustrating a mounting device according to an embodiment.

FIG. 1 is a block diagram illustrating a mounting device 1 according to an embodiment.

Referring to FIG. 1, the mounting device 1 according to the embodiment may be a three-dimensional mounting device which performs a position registration between an object at the top and an object at the bottom by using a dual field-of-view (FOV) optical system 30, and mounts the object at the top on the object at the bottom. The mounting device 1 may include a bonding head 10, a bonding stage 20, the dual FOV optical system 30, an inclination sensor 40, a calibrator 50, and first and second tilt sensors 60a and 60b.

The components of the mounting device 1 may be disposed on a base frame 70. The base frame 70 may take a form of a rectangular parallelepiped, and may include a base 71, an upper frame 72, and a side frame 73. The side frame 73 may be arranged on the base 71, and may support the upper frame 72.

Here, for convenience of description of the mounting device 1, an XYZ orthogonal coordinate system is introduced. For example, a direction orthogonal to a top surface of the base 71 is defined as a Z-axis direction, and two directions orthogonal to each other in a plane parallel to the top surface of the base 71 are defined as an X-axis direction and a Y-axis direction. Furthermore, a +Z-axis direction is upward and a −Z-axis direction is downward. In addition, upward and downward are defined for convenience of description of the mounting device 1, and are not limited to directions when the mounting device 1 is actually used.

The bonding head 10 may hold a first object Ma. The first object Ma is a member to be bonded onto a second object Mb. The first object Ma may be, for example, a member, such as a die. The first object Ma is not limited to a die, and may be a member, such as a wafer, a chip, or an interposer. The bonding head 10 may include a head 11 and a first driver 12.

The head 11 may hold the first object Ma. For example, the head 11 may adsorb and grip the first object Ma. The first driver 12 may be coupled to the upper frame 72. The first driver 12 may move the head 11 in the X-axis direction, the Y-axis direction, and/or the Z-axis direction. The first driver 12 may rotate the head 11 along at least one rotating axis in parallel with at least one of the X axis, the Y axis, and the Z axis. That is, the head 11 may be rotated with respect to at least one rotating axis in at least one of the X-axis direction, the Y-axis direction and the Z-axis direction. In this way, the bonding head 10 may function as a bonding tool.

The first driver 12 may linearly move the head 11 along at least one linear movement axis in at least one of the X-axis direction, the Y-axis direction and the Z-axis direction, and may also rotate the head 11 along at least one of rotating axes Tx, Ty and Tz based on at least one of the X-axis direction, the Y-axis direction and the Z-axis direction, respectively. The bonding head 10 may adjust a relative position and parallelism between the first object Ma at the top and the second object Mb at the bottom. The bonding head 10 may bond the first object Ma to the second object Mb.

The bonding stage 20 may hold the second object Mb. The second object Mb may be, for example, a member, such as a wafer. In addition, the second object Mb may not limited to a wafer, and may be a member, such as a chip or an interposer. In embodiments, the second object Mb may include a plurality of mounting positions and, in the plurality of mounting positions, the first object Ma, which may be a single object or structure, may be mounted or a plurality of first objects Ma may be stacked in a vertical direction. The second object Mb may be a member that is the lowermost layer of a stacked body. The bonding stage 20 includes a stage 21 and a second driver 22.

The stage 21 may hold the second object Mb. For example, the stage 21 may adsorb the second object Mb. The second driver 22 may be fixed to the base 71. The second driver 22 may move the stage 21 in at least one of the X-axis direction and the Y-axis direction. Accordingly, the bonding stage 20 may move the second object Mb in at least one of the X-axis direction and the Y-axis direction. In addition, the second driver 22 may move the stage 21 in the Z-axis direction. Furthermore, the second driver 22 may rotate the stage 21 along at least one rotating axis in parallel with at least one of the X axis, the Y axis and the Z axis. That is, the stage 21 may be rotated with respect to at least one rotating axis in at least one of the X-axis direction, the Y-axis direction and the Z-axis direction.

The bonding stage 20 may linearly move and/or rotate instead of or in addition to the movement of the bonding head 10. The bonding stage 20 may linearly move the stage 21 along at least one linear movement axis in at least one of the X-axis direction, the Y-axis direction and the Z-axis direction, and rotate the stage 21 along at least one of rotating axes Tx, Ty and Tz based on at least one of the X-axis direction, the Y-axis direction and the Z-axis direction, respectively. Accordingly, the bonding stage 20 may adjust a relative position and parallelism between the first object Ma at the top and the second object Mb at the bottom. In addition, the bonding stage 20 may bond the first object Ma to the second object Mb. In this way, the bonding stage 20 may function as a bonding tool.

The dual FOV optical system 30 may be inserted between the first object Ma and the second object Mb to capture images of the first object Ma and the second object Mb. The first object Ma and the second object Mb may be positioned left and right as well as up and down with respect to the dual FOV optical system when the dual FOV optical system 30 is inserted between the first object Ma and the second object Mb. The dual FOV optical system 30 may simultaneously capture the first object Ma and the second object Mb in two opposite directions such as left and right or up and down.

The dual FOV optical system 30 may include an optical device 31, such as a camera or imaging device, and a third driver 32. The third driver 32 may be fixed to the base frame 70. For example, the third driver 32 may be fixed to the upper frame 72. The third driver 32 may move the optical device 31 in at least one of the X-axis direction, the Y-axis direction and the Z-axis direction. In addition, the third driver 32 may rotate the optical device 31 along at least one rotating axis in parallel with at least one of the X axis, the Y axis and the Z axis. That is, the optical device 31 may be rotated with respect to at least one rotating axis in at least one of the X-axis direction, the Y-axis direction and the Z-axis direction. The third driver 32 may move the optical device 31 to a position between alignment marks provided in the first and second objects Ma and Mb. In addition, the third driver 32 may move the optical device 31 in the Z-axis direction to adjust a focus of the optical device 31. In addition, the third driver 32 may adjust an inclination of the dual FOV optical system 30.

According to embodiments, the third driver 32 as well as the first driver 12 and the second driver 22 described above may be embodied as various numbers of hardware, software and/or firmware structures that execute respective functions described above. Each of the at least one of these components may use a direct circuit structure, such as a memory, a processor, a logic circuit, a look-up table, etc. that may execute the respective functions through controls of one or more microprocessors or other control apparatuses. Also, at least one of these drivers 12, 22 and 32 may be specifically embodied by a module, a program, or a part of code, which contains one or more executable instructions for performing specified logic functions, and executed by one or more microprocessors or other control apparatuses. Further, at least one of these drivers 12, 22 and 32 may include or may be implemented by a processor such as a central processing unit (CPU) that performs the respective functions, a microprocessor, or the like The inclination sensor 40 may detect the inclination of the dual FOV optical system 30. The inclination sensor 40 may include, for example, a measurement unit 41 and a target 42. The measurement unit 41 is fixed to the upper frame 72 of the base frame 70. The target 42 may be fixed to the optical device 31 of the dual FOV optical system 30. The inclination sensor 40 may measure the target 42 by the measurement unit 41 to measure a posture (or an inclination) of the dual FOV optical system 30 with respect to a reference direction. For example, the inclination sensor 40 measures the posture of the dual FOV optical system 30 with respect to the base frame 70 by measuring the target 42.

The measurement unit 41 may include, for example, a camera, a laser autocollimator, etc., and the target 42 may include, for example, a flat mirror. The measurement unit 41 may include three or more distance measuring sensors, and may measure an inclination angle from a distance of three or more points obtained by the distance measuring sensors.

The calibrator 50 may serve as a reference for optical characteristics of optical elements provided in the dual FOV optical system 30. The calibrator 50 may be fixed to the bonding stage 20 or the base 71. The calibrator 50 may include an upper plane 51, a lower plane 52, and a support 53. The support 53 may extend from the lower plane 52 to the upper plane 51. The support 53 may support the upper plane 51. The upper plane 51 and the lower plane 52 may face each other.

The calibrator 50 may include a pair of calibration patterns arranged on the upper plane 51 and the lower plane 52 facing each other. A distance between the upper plane 51 and the lower plane 52, parallelism between the upper plane 51 and the lower plane 52, and/or a relative position between the pair of calibration patterns (that is, the relative position of the calibration pattern arranged on the upper plane 51 and the calibration pattern arranged on the lower plane 52 with respect to each other) may be preset. For example, the distance between the upper plane 51 and the lower plane 52 may be set as a distance between a first bonding surface of the first object Ma and a second bonding surface of the second object Mb, and the upper plane 51 and the lower plane 52 may be set to be parallel to each other. The dual FOV optical system 30 may be inserted between the upper plane 51 and the lower plane 52. In this case, the relative position between the pair of calibration patterns may be set such that the calibration pattern arranged on the upper plane 51 and the calibration pattern arranged on the lower plane 52 face an upper FOV and a lower FOV of the dual FOV optical system 30, respectively.

By recognizing the calibration patterns provided to the calibrator 50, the dual FOV optical system 30 may correct parameters of the optical device 31 of the dual FOV optical system 30, for example, an optical magnification, a relative relationship between the center of the upper FOV and the center of the lower FOV, lens distortion, an installation error of the target 42 of the inclination sensor 40, and a position of the dual FOV optical system 30 in the mounting device 1. The dual FOV optical system 30 may detect a change over time in optical characteristics of the optical elements provided in the dual FOV optical system 30 by using the calibrator 50 at a predetermined time interval or period. In embodiments, by controlling an arrangement of the calibrator 50, an inspection using the calibrator 50 may be performed simultaneously with a process of picking up the first object Ma. For example, while performing a process of picking up the first object Ma, the bonding stage 20 to which the calibrator 50 is fixed may be arranged to move near the dual FOV optical system 30. Accordingly, while the bonding head 10 holds the first object Ma, the dual FOV optical system 30 may detect the change over time in optical characteristics of the optical elements by using the calibrator 50.

Figure 2:
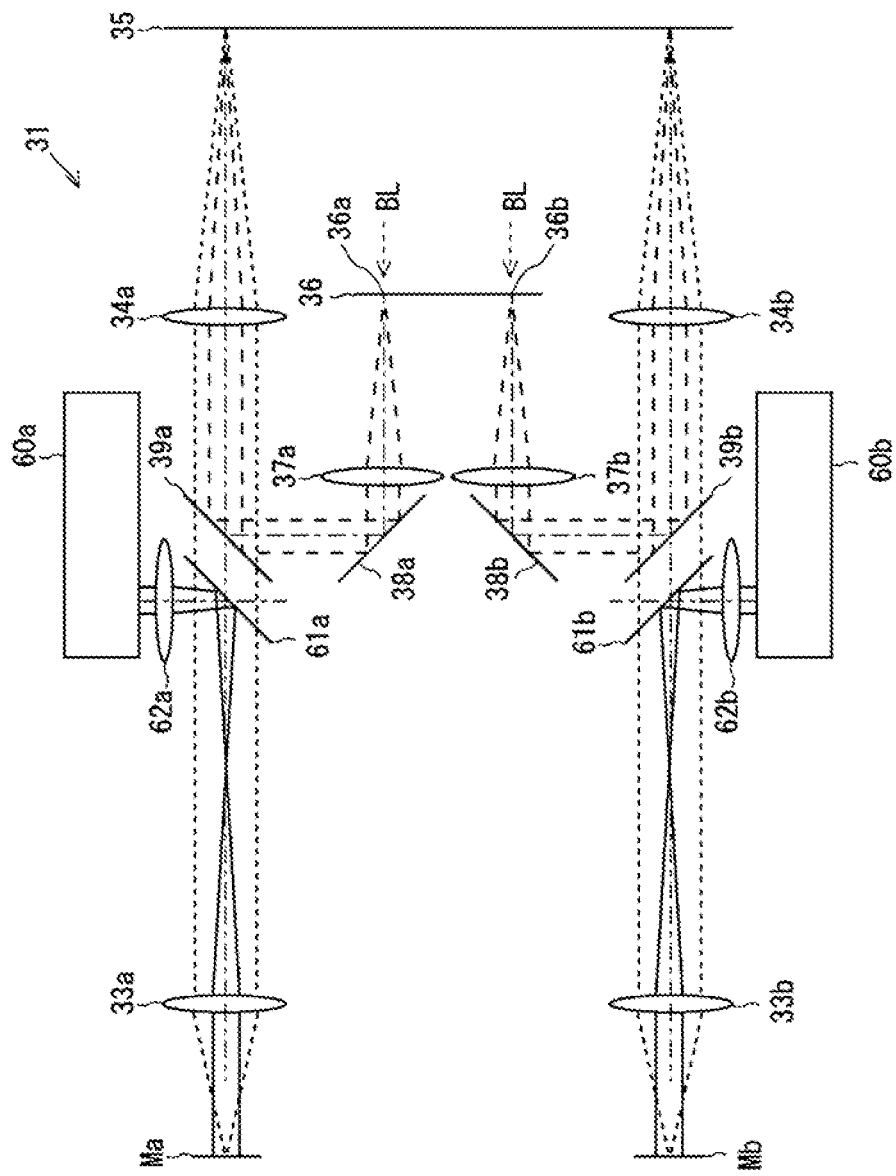
FIG. 2 is a block diagram illustrating an optical device of a dual-field-of-view (FOV) optical system in a mounting device, according to an embodiment.

FIG. 2 is a block diagram illustrating the optical device 31 of the dual FOV optical system 30 in the mounting device 1, according to an embodiment.

Referring to FIG. 2, the optical device 31 of the dual FOV optical system 30 may include a plurality of optical elements, an image sensor 35, a fiducial mark 36, a backlight BL, a case, and at least one light source.

The plurality of optical elements may include, for example, a first objective lens 33a, a second objective lens 33b, a first tube lens 34a, and a second tube lens 34b. An image of the first object Ma may be formed on the image sensor 35 through the first objective lens 33a and the first tube lens 34a. An image of the second object Mb may be formed on the image sensor 35 through the second objective lens 33b and the second tube lens 34b.

For example, the image sensor 35 may simultaneously capture a first alignment mark formed in the first object Ma and a second alignment mark formed in the second object Mb to obtain an image including an image of the first alignment mark and an image of the second alignment mark. For example, the image sensor 35 may include a complementary metal-oxide-semiconductor (CMOS) sensor and/or a charge-coupled device (CCD) sensor. The plurality of optical elements may form the image of the first alignment mark and the image of the second alignment mark on the image sensor 35. In addition, in some embodiments, a configuration of imaging the first object Ma on the image sensor 35 and a configuration of imaging the second object Mb on the image sensor 35 may be formed of a common objective lens and a common tube lens. That is, the first objective lens 33a and the second objective lens 33b may be replaced by the common objective lens, and the first tube lens 34a and the second tube lens 34b may be replaced by the common tube lens.

In FIG. 2, for convenience sake, both the first object Ma and the second object Mb are illustrated as being on the left side of the optical device 31. However, as illustrated in FIG. 1, the first object Ma and the second object Mb are spaced apart from each other with the optical device 31 therebetween. In FIG. 2, some optical elements are omitted from the optical device 31. For example, in FIG. 2, for convenience of description of the dual FOV optical system 30, bending of a light path is minimally illustrated. However, an optical element (for example, a flat mirror) for bending the light path may be provided in the case of the optical device 31. The case of the optical device 31 may fix the plurality of optical elements in the optical device 31. The case of the optical device 31 may be a housing of the optical device 31.

Figure 3:
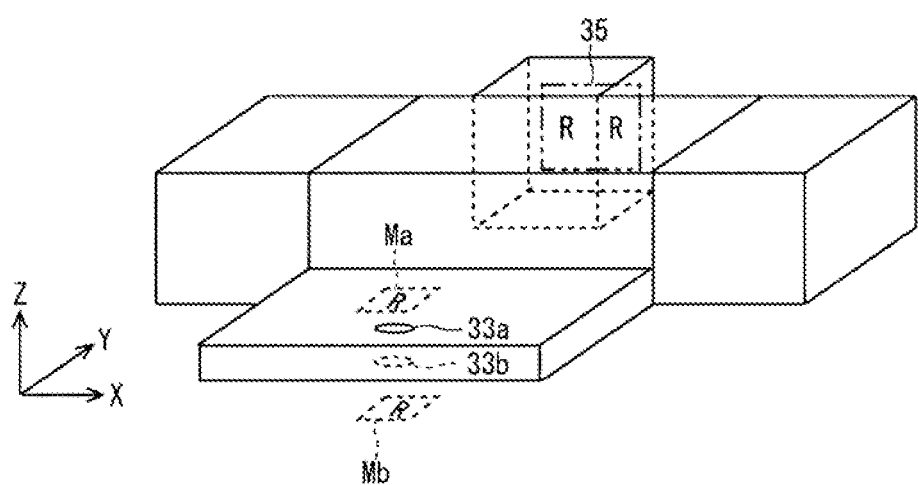
FIGS. 3 to 5 are views illustrating images formed on an image sensor in a mounting device, according to embodiments.
Figure 4:
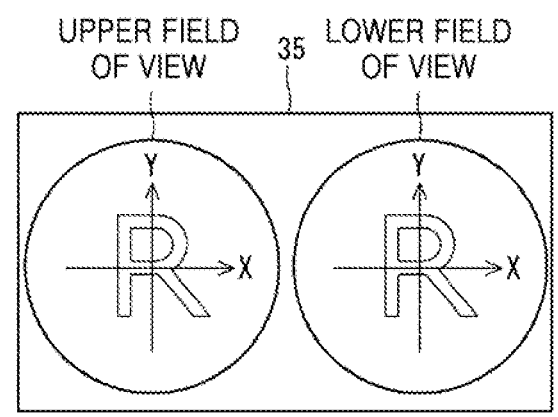
Figure 5:
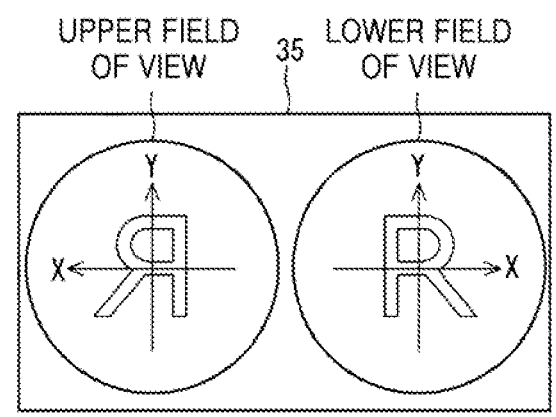

FIGS. 3 to 5 are views illustrating images formed on the image sensor 35 in the mounting device 1, according to embodiments.

As illustrated in FIGS. 3 and 4, in images of the first and second objects Ma and Mb formed on the image sensor 35, directions of coordinates may be aligned with each other. By properly determining the number of reflections of light in the optical device 31, directions of the images of the first and second objects Ma and Mb viewed from the dual FOV optical system 30 and directions of the image sensor 35 may be aligned so that the directions of the images of the first and second objects Ma and Mb viewed from the dual FOV optical system 30 are not opposite to the directions of the image sensor 35.

For example, the dual FOV optical system 30 may be set such that a first direction (for example, the −Z-axis direction) of the first alignment mark viewed from the dual FOV optical system 30 and a second direction (for example, the −Z-axis direction) of the second alignment mark viewed from the dual FOV optical system 30 are the same as the first direction and the second direction on the image sensor 35. In other words, the first direction (for example, the −Z-axis direction) of the first alignment mark viewed from the dual FOV optical system 30 and the second direction (for example, the −Z-axis direction) of the second alignment mark viewed from the dual FOV optical system 30 may be the same as one direction of the image sensor 35. Accordingly, an error factor of a parallel movement component of the image sensor 35 may be excluded so that high precision may be achieved.

As illustrated in FIG. 5, when the directions of the coordinates are not constant (that is, are not aligned) in the images of the first and second objects Ma and Mb formed on the image sensor 35, a change over time in position of the image sensor 35 may be a recognition error. In this case, for example, correction may be periodically performed based on a fiducial mark.

Referring to FIG. 2 again, the first and second tilt sensors 60a and 60b may measure an angle between the dual FOV optical system 30 and each of the first and second bonding surfaces of the first and second objects Ma and Mb by using the optical elements of the dual FOV optical system 30. The first tilt sensor 60a may measure an angle between the first bonding surface and the dual FOV optical system 30. The second tilt sensor 60b may measure an angle between the second bonding surface and the dual FOV optical system 30. The first and second tilt sensors 60a and 60b may detect a parallelism between the first and second bonding surfaces of the first and second objects Ma and Mb. The first and second tilt sensors 60a and 60b may include, for example, an autocollimator using laser light as detection light. The autocollimator includes a light emitter emitting the detection light and a light receiver receiving the detection light. The autocollimator may use a detection light transmitted through at least one optical element of the dual FOV optical system 30. For example, the autocollimator may use a detection light transmitted through the first and second objective lenses 33a and 33b. In addition, each of the first and second tilt sensors 60a and 60b may be an electronic sensor detecting a parallelism by an amount of side slip on a reticle.

The plurality of optical elements of the dual FOV optical system 30 may form the image of the first alignment mark formed on the first bonding surface of the first object Ma and the image of the second alignment mark formed on the second bonding surface of the second object Mb on the image sensor 35. Illumination light used for imaging the first alignment mark and the second alignment mark may have a wavelength that is different from that of the detection light of the autocollimator.

The first and second tilt sensors 60a and 60b may use the detection light transmitted along a common light path shared by the optical elements of the dual FOV optical system 30 in the optical device 31. When a green light is used as the illumination light for recognizing the images of the first and second alignment marks, the first and second tilt sensors 60a and 60b may use a red light as the detection light for the autocollimator. In addition, the optical elements may include first and second dichroic mirrors 61a and 61b. The first and second dichroic mirrors 61a and 61b may combine and/or divide the illumination light and the detection light.

For example, a detection light reflected from the first object Ma passes through the first objective lens 33a, reflected from the first dichroic mirror 61a, and detected by the first tilt sensor 60a through a first lens 62a. In addition, a detection light reflected from the second object Mb passes through the second objective lens 33b, reflected from the second dichroic mirror 61b, and detected by the second tilt sensor 60b through a second lens 62b.

In order to miniaturize the autocollimators used as the first and second tilt sensors 60a and 60b and to make laser autocollimators used as the first and second tilt sensors 60a and 60b have high speed and high precision, the light receiver of each of the autocollimators may include a 4photodiode (PD) or position sensitive detector (PSD). Because quality of strength distribution of a detected laser spot is important in the 4PD or PSD, a research on preventing faint light or ghost (a fake spot generated by reflecting a part of light from a transmissive surface) from being generated in a round-trip light path is required. Instead of the 4PD and PSD, a two-dimensional image sensor, such as a CMOS sensor, may be used. When the two-dimensional image sensor is used, faint light or ghost may be removed by image processing so that load on an optical design may be reduced.

In embodiments, in order to coincide an image recognition range with a parallelism measurement range, light paths of imaging systems of the first and second objects Ma and Mb may be coaxial with light paths of imaging systems of the first and second tilt sensors 60a and 60b. However, when there are limitations on designing by sharing the light paths, the coaxial structure may not be used, and instead, the light paths of the imaging systems of the first and second tilt sensors 60a and 60b may be arranged near the light paths of the imaging systems of the first and second objects Ma and Mb.

Figure 6:
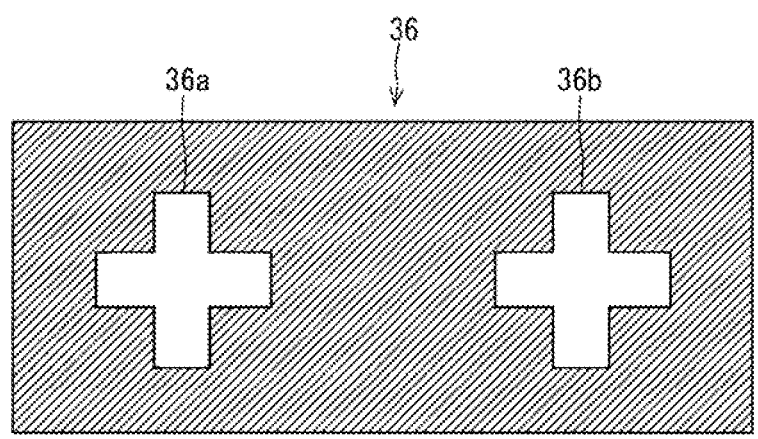
FIG. 6 is a view illustrating a fiducial mark of a dual FOV optical system in a mounting device, according to an embodiment.

FIG. 6 is a view illustrating the fiducial mark 36 of the dual FOV optical system 30 in the mounting device 1, according to an embodiment.

Referring to FIGS. 2 and 6, the fiducial mark 36 may be fixed in the case of the dual FOV optical system 30. The fiducial mark 36 may include a first fiducial mark 36a for the upper FOV and a second fiducial mark 36b for the lower FOV. The first and second fiducial marks 36a and 36b may be arranged to be in an optical conjugation relationship with the image sensor 35. For example, each of the first and second fiducial marks 36a and 36b may include a slit and/or a reticle provided on a shading plate. By using the fiducial mark 36, the effect of the change over time of the image sensor 35 may be corrected.

Figure 7:
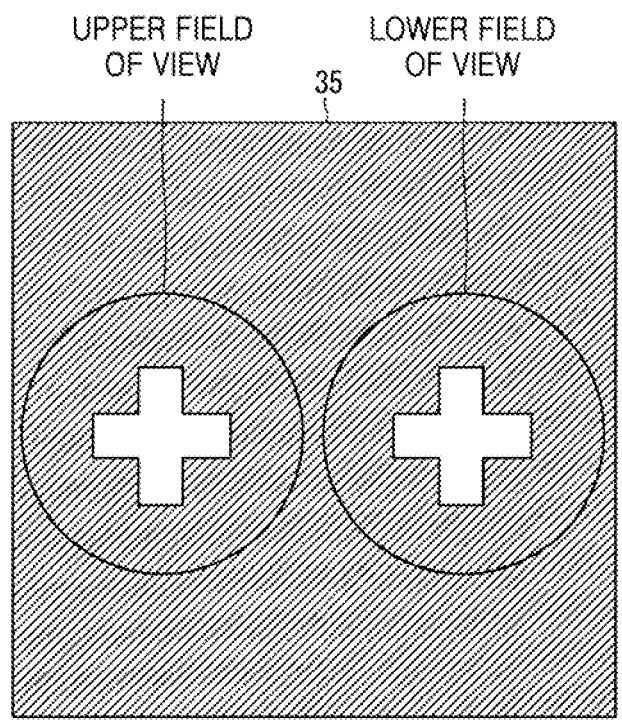
FIG. 7 is a view illustrating a fiducial mark formed on an image sensor in a mounting device, according to an embodiment.

FIG. 7 is a view illustrating the fiducial mark 36 formed on the image sensor 35 in the mounting device 1, according to an embodiment.

As illustrated in FIGS. 2 and 7, an image of the fiducial mark 36 may be captured by the image sensor 35. An image of the first fiducial mark 36a may be formed on the image sensor 35 through an objective lens 37a, a mirror 38a, a mirror 39a, and the first tube lens 34a. An image of the second fiducial mark 36b may be formed on the image sensor 35 through an objective lens 37b, a mirror 38b, a mirror 39b, and the second tube lens 34b. The objective lenses 37a and 37b may be used only for imaging the first and second fiducial marks 36a and 36b, and the first and second tube lenses 34a and 34b may be used for imaging the first and second objects Ma and Mb and the first and second fiducial marks 36a and 36b.

The first and second fiducial marks 36a and 36b may be fixed in, for example, the case of the dual FOV optical system 30 to prevent misalignment or expansion and contraction that may occur due to heat or mechanical stress. When the images of the first and second fiducial marks 36a and 36b are obtained by the image sensor 35, the backlight BL for the first and second fiducial marks 36a and 36b may be turned on, and transmitted lights of the first and second fiducial marks 36a and 36b may be captured. By turning off the backlight BL, the images of the first and second fiducial marks 36a and 36b may not be reflected on the image sensor 35.

As described above, the dual FOV optical system 30 may include the light source for the backlight BL as a switch obtaining the image of the fiducial mark 36 by the image sensor 35 at a predetermined point in time. In addition, the switch allowing the image of the fiducial mark 36 to be obtained by the image sensor 35 is not limited to on-off control of the backlight BL, and may be implemented by physical movements of optical elements such as the plurality of mirrors 38a, 38b, 39a and 39b. It may be possible to prevent light of the backlight BL from interfering with capturing the first and second objects Ma and Mb by using at least one of the mirrors 38a, 38b, 39a and 39b as a switch. In addition, the point in time at which the image of the fiducial mark 36 is obtained by the image sensor 35 may be after inserting the dual FOV optical system 30 between the first object Ma and the second object Mb, and immediately before obtaining the images of the first and second alignment marks of the first and second objects Ma and Mb by the image sensor 35. However, the disclosure is not limited thereto, and the image of the fiducial mark 36 may be obtained by the image sensor 35 after the images of the first and second alignment marks of the first and second objects Ma and Mb are obtained by the image sensor 35.

A pair of upper and lower alignment marks may be formed on the first and second objects Ma and Mb. When sizes of the first and second objects Ma and Mb are greater than the upper and lower FOVs, the dual FOV optical system 30 may be moved to a plurality of positions of each of the first and second objects Ma and Mb to recognize a pair of alignment marks in each of the plurality of positions. The bonding head 10 and/or the bonding stage 20 functioning as the bonding tool may perform bonding between the first and second objects Ma and Mb based on the image obtained by the image sensor 35 so that misalignments of all the alignment marks are minimized. The bonding head 10 and/or the bonding stage 20 may adjust the relative position and parallelism between the first object Ma at the top and the second object Mb at the bottom based on the image obtained by the image sensor 35, and initiating a bonding process between the first object Ma and the second object Mb.

After preparing a measure for suppressing a mounting error as described above, test mounting may be further performed in advance in order to avoid a remaining bonding error. For example, glass or a dummy chip may be used for the test mounting. Because the alignment marks may be observed from a surface or a back side of the dummy chip, after the test mounting is completed by using the dummy chip, alignment marks of a stacked structure including the dummy chip may be simultaneously recognized by using a lower FOV of the dual FOV optical system 30 from the top of the dummy chip. Misalignment between the alignment marks may be stored as a remaining mounting error, and a value obtained by subtracting the remaining mounting error may be used as a target value during actual mounting.

Figure 8:
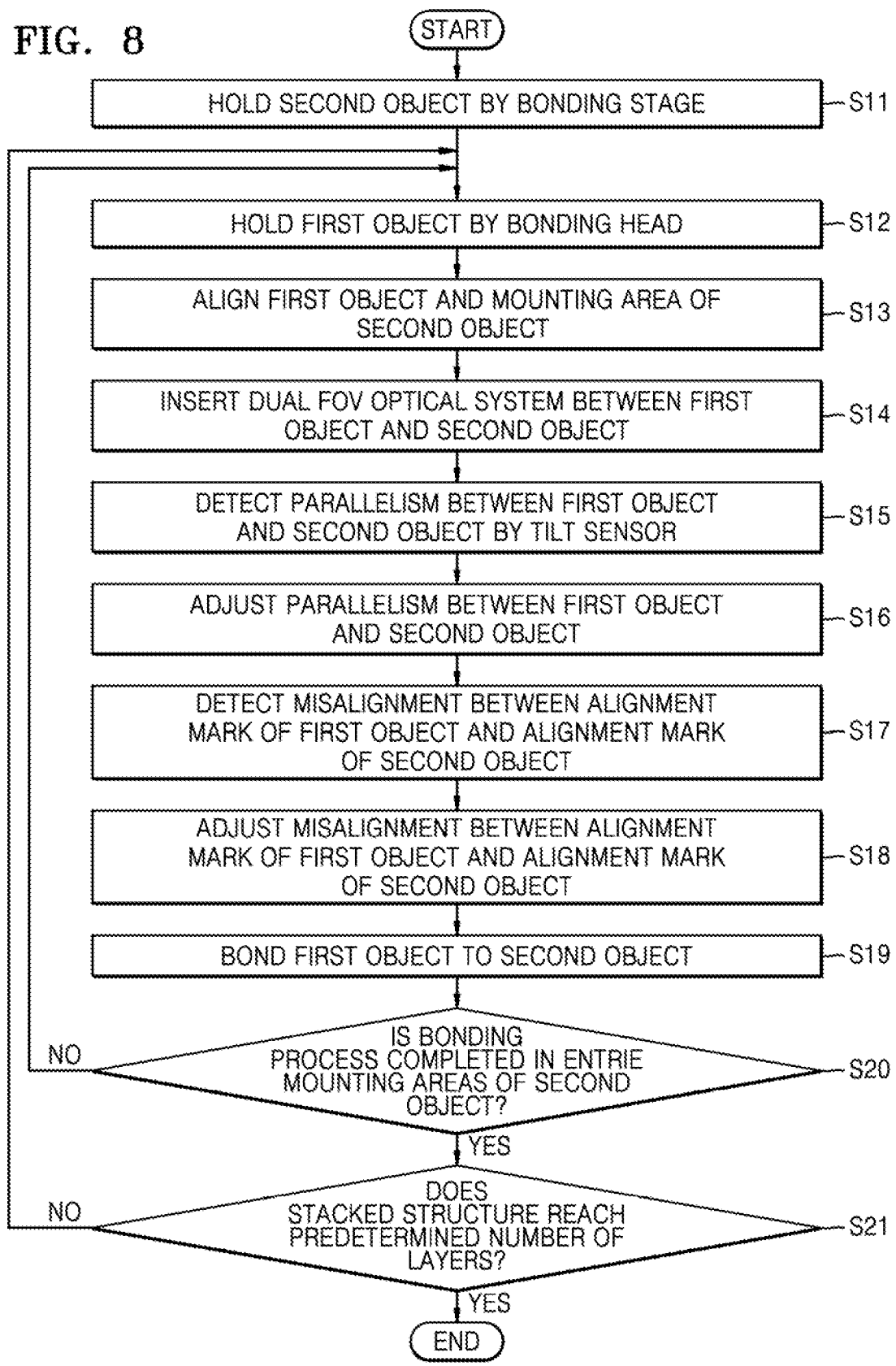
FIG. 8 is a flowchart illustrating a mounting method, according to an embodiment.

Hereafter, a mounting method using the mounting device 1 according to the embodiments will be described. FIG. 8 is a flowchart illustrating a mounting method according to an embodiment.

In operation S11, the second object Mb at the bottom may be held by the bonding stage 20.

In operation S12, the first object Ma at the top may be held by the bonding head 10. For example, an object supply (for example, a die lifter) configured to supply the first object Ma may be provided on the bonding stage 20. When the bonding stage 20 is moved to a proper position so that the object supply is positioned below the bonding head 10, the head 11 of the bonding head 10 may grip the first object Ma provided by the object supply.

As the calibrator 50 is fixed to the bonding stage 20 or the base 71, the dual FOV optical system 30 may detect a change over time in optical characteristics of the dual FOV optical system 30 by using the calibrator 50 while the bonding head 10 holds the first object Ma. In addition, by detecting the change over time in optical characteristics of the dual FOV optical system 30 by using the calibrator 50 at a predetermined time interval, the dual FOV optical system 30 may be regularly checked and the optical parameters of the optical elements of the optical device 31 may be corrected.

In operation S13, the first object Ma and a mounting position of the second object Mb may be aligned with each other. For example, by moving the bonding stage 20, the mounting position of the second object Mb and the bonding head 10 may be vertically aligned with each other. That is, the first object Ma held by the bonding head 10 may vertically overlap the mounting position of the second object Mb.

In operation S14, the dual FOV optical system 30 may be inserted between the first object Ma at the top and the second object Mb at the bottom. Then, images of the first and second objects Ma and Mb may be simultaneously captured by the dual FOV optical system 30. For example, as the dual FOV optical system 30 is inserted between the first object Ma and the second object Mb, the first and second alignment marks of the first and second objects Ma and Mb may be obtained through the upper and lower FOVs of the dual FOV optical system 30.

In operation S15, parallelism between the first and second objects Ma and Mb may be detected by the first and second tilt sensors 60a and 60b. For example, the parallelism between the first and second bonding surfaces of the first and second objects Ma and Mb may be detected by the first and second tilt sensors 60a and 60b. In addition, inclination of the dual FOV optical system 30 may be detected by the inclination sensor 40.

In operation S16, the detected parallelism between the first object Ma and the second object Mb may be adjusted. For example, the detected parallelism between the first object Ma and the second object Mb may be adjusted by at least one of the bonding head 10 and the bonding stage 20. In addition, the inclination of the dual FOV optical system 30, which may be detected by the inclination sensor 40, may be adjusted by the third driver 32 of the dual FOV optical system 30.

In operation S17, misalignment between the first alignment mark of the first object Ma and the second alignment mark of the second object Mb may be detected by the image sensor 35. For example, the image sensor 35 of the dual FOV optical system 30 may simultaneously capture an image of the first alignment mark formed on the first object Ma and an image of the second alignment mark formed on the second object Mb.

Before obtaining the images of the first and second alignment marks simultaneously captured by the image sensor 35, an image of the fiducial mark 36 may be obtained by the image sensor 35 as necessary. For example, when the first object Ma and the second object Mb are bonded to each other, the image of the fiducial mark 36 may be obtained by the image sensor 35 and misalignment between the first object Ma and the second object Mb, which is caused by the change over time in position of the image sensor 35, may be detected and corrected based on the obtained image of the fiducial mark 36. Based on information on the obtained image of the fiducial mark 36 and information on the posture of the dual FOV optical system 30, which may be measured by the inclination sensor 40, an amount of misalignment between the first alignment mark of the first object Ma and the second alignment mark of the second object Mb may be calculated.

In operation S18, the misalignment between the first alignment mark of the first object Ma and the second alignment mark of the second object Mb may be adjusted. For example, a relative position of the first object Ma and the second object Mb with respect to each other may be adjusted by moving at least one of the bonding head 10 and the bonding stage 20 based on the images of the first and second alignment marks of the first and second objects Ma and Mb obtained by the image sensor 35.

In operation S19, the first object Ma and the second object Mb may be bonded to each other. For example, the bonding head 10 may be lowered and a predetermined pressure may be applied to bond the first object Ma at the top to the second object Mb at the bottom.

In operation S20, it may be determined whether the bonding process is completed in the entire mounting positions of the second object Mb. When it is determined that the bonding process is not completed in the entire mounting positions of the second object M, the process returns to operation S12 and operations S12 to S20 may be repeated. In operation S20, when it is determined that the bonding process is completed in the entire mounting positions of the second object Mb, as illustrated in operation S21, it may be determined whether a stacked structure obtained by bonding the first object Ma to the second object Mb includes a predetermined number of layers. When it is determined that the stacked structure does not include the predetermined number of layers, the process may return to operation S12 and operations S12 to S21 may be repeated. In operation S21, it is determined that the stacked structure includes the predetermined number of layers, the mounting process may be terminated. A semiconductor device including the first and second objects Ma and Mb may be manufactured by the mounting method using the mounting device.

In a general mounting device, a dual FOV optical system includes an image sensor recognizing an upper object and an image sensor recognizing a lower object. In this case, errors generated by each image sensor are accumulated so that recognition precision deteriorates.

In the general mounting device, misalignments occur in the image sensors used for the dual FOV optical system due to thermal and mechanical factors. The misalignment of the image sensors may be determined and corrected by using fiducial marks provided on a frame of the mounting device. In this case, a process time spent on determining and correcting the misalignment of the image sensors by using the fiducial marks is too long so that a throughput deteriorates. In addition, a method of monitoring a temperature inside the dual FOV optical system, remembering a relationship between the temperature and the errors, and estimating an error based on the relationship between the temperature and the errors to correct the misalignment of the image sensors may be used. However, because deformation caused by thermal stress is accompanied by a time delay and hysteresis in accordance with a temperature change history, there are limitations on correction precision.

In the general mounting device, when alignment marks of objects to be bonded are simultaneously recognized, a large error is added to recognition results of the alignment marks when a posture of the dual FOV optical system is slightly inclined. When a distance between the objects to be bonded is h mm, and a posture error of the dual FOV optical system is θ rad, a recognition error Δ may be represented by equation (1).

$$\Delta = h \times \tan\theta \tag{1}$$

For example, when h=20 mm and θ=2.5 μrad, Δ=50 nm. Therefore, when recognition precision is targeted at a degree of several nanometers (nm), a posture error of the dual FOV optical system may not be ignorable. Because the dual FOV optical system enters and retreats between the objects to be bonded to recognize an image, the dual FOV optical system has a driving shaft. In this case, because suppressing pitching and rolling of the driving shaft to several micro radian (μrad) leads to an increase in cost, it is required to determine and correct the posture of the dual FOV optical system by a simpler method.

When the objects to be bonded are inclined, an error may occur in the result of image recognition, and when the objects to be bonded are mounted, a part of the upper object first contacts the lower object so that a side slip may occur. Even when a bonding stage holding the lower object and a bonding head holding the upper object are parallel to each other with sufficient precision, the objects to be bonded may deviate from the parallelism due to warpage of the objects to be bonded or non-uniformity in thicknesses of the objects to be bonded. Therefore, it is necessary to determine and correct parallelism between bonding surfaces of the objects to be bonded before mounting the objects to be bonded.

Because optical characteristics of optical elements of the dual FOV optical system cause a change over time, regular detection is required.

The mounting device 1 according to the above embodiments may mount the first and second objects Ma and Mb with high precision by at least one of simultaneously obtaining images of the first and second objects Ma and Mb by the image sensor 35, having the dual FOV optical system 30 include the fiducial mark 36, having the dual FOV optical system 30 include the first and second tilt sensors 60*a* and 60*b*, having a function of correcting a change in posture of the dual FOV optical system 30, and determining and correcting a change over time in the dual FOV optical system 30 by using the calibrator 50.

According to embodiments, the dual FOV optical system 30 may simultaneously capture the first and second objects Ma and Mb by the image sensor 35. The image sensor 35 causes misalignment over time due to thermal and mechanical factors. An amount of misalignment of the image sensor 35 due to the change over time may be added as an error of recognition positions of the first and second objects Ma and Mb. In addition, an attention point on an image fluctuates in time due to fine mechanical vibration. Although optical magnification tends to increase to improve image recognition precision, the higher the optical magnification, the greater the effect of fine vibration on capturing quality. Therefore, when the images of the first and second objects Ma and Mb are not simultaneously captured, an error caused by fluctuation may be added.

When the image sensor 35 separately captures the image of the first object Ma at the top and the image of the second object Mb at the bottom, because independent errors may be generated by the image of the first object Ma at the top and the image of the second object Mb at the bottom, an error may accumulate in "a relative position between the first and second objects Ma and Mb calculated from the results obtained based on the image of the first object Ma and the image of the second object Mb. However, when the image of the first object Ma at the top and the image of the second object Mb at the bottom are simultaneously captured by the image sensor 35, because the relative position between the first and second objects Ma and Mb may be calculated from one image, accumulation of errors caused by the misalignment of the image sensor 35 and accumulation of errors caused by capturing timing deviation may be removed or reduced so that recognition precision of the image sensor 35 may improve. In addition, when the dual FOV optical system is arranged so that a relative posture (direction) between the image of the first object Ma at the top and the image of the second object Mb at the bottom is the same as a relative posture (direction) between the first object Ma at the top and the second object Mb at the bottom, misalignment (for example, by a parallel movement component) of the image sensor 35 may be prevented.

According to embodiments, in order to determine and correct the misalignment of the image sensor 35 over time, the fiducial mark 36 always reflected in the field of view of the dual FOV optical system 30 may be provided in the optical device 31. The fiducial mark 36 may be formed in the optical device at a position where an image of the fiducial mark 36 is always captured by the image sensor 35 when the image sensor 35 captures images of target objects for bonding in the mounting device 1 such as the images of the first and second objects Ma and Mb. The image sensor 35 may cause misalignment over time due to thermal and mechanical factors, and the amount of misalignment may be added as an error of a recognition position as it is. The fiducial mark 36, such as a slit or a reticle, may be provided to be in an optical conjugation relationship with the image sensor 35 in the dual FOV optical system 30. In addition, when the image of the fiducial mark 36 is captured by the backlight BL, an amount of movement over time of a pixel may be determined based on the fiducial mark 36. When the backlight BL is turned off, the image of the fiducial mark 36 may not be visible, and only the first and second objects Ma and Mb may be reflected. By determining misalignment of the image sensor 35 immediately before recognizing the first and second objects Ma and Mb and correcting the misalignment of the image sensor 35 from the result obtained by recognizing the fiducial mark 36, the recognition error caused by the change over time in the image sensor 35 may be prevented or reduced. In addition, because the misalignment of the image sensor 35 may be confirmed through the fiducial mark 36 every time before mounting the first object Ma on the second object Mb, the recognition error caused by the change over time in the image sensor 35 may be reduced. According to embodiments, because the misalignment of the image sensor 35 may be detected through the fiducial mark 36 mounted in the dual FOV optical system 30, the misalignment of the image sensor 35 may be detected without deteriorating throughput.

According to embodiments, a mechanism determining and correcting a change in posture of the dual FOV optical system 30 may be provided. When the first and second alignment marks of the first and second objects Ma and Mb are simultaneously recognized in the dual FOV optical system 30, if the dual FOV optical system 30 is inclined from a reference posture, a large error may be added to the recognition results of the first and second alignment marks. The dual FOV optical system 30 may have a driving shaft for moving to a capturing position between the first and second objects Ma and Mb for performing image recognition. Limiting pitching and rolling of the driving shaft to several prad may lead to an increase in device cost. Accordingly, according to embodiments, the mounting device 1 may include the inclination sensor 40 measuring the pitching and rolling of the dual FOV optical system 30. Accordingly, the images of the first and second objects Ma and Mb may be recognized and the posture of the dual FOV optical system 30 may be determined by the inclination sensor 40. Accordingly, when a relative position between the first and second objects Ma and Mb is calculated, an error caused by a change in posture of the dual FOV optical system 30 may be prevented or reduced, and the recognition precision may improve.

According to embodiments, the dual FOV optical system 30 may include the first and second tilt sensors 60a and 60b in order to determine and correct parallelism between a first bonding surface of the first object Ma and a second bonding surface of the second object Mb. The parallelism between the first bonding surface of the first object Ma and the second bonding surface of the second object Mb may be measured by the first and second tilt sensors 60a and 60b at the same time at which the images of the first and second alignment marks are captured or recognized by the dual FOV optical system 30. For example, the first and second tilt sensors 60a and 60b may include small laser autocollimators. By coaxially irradiating a detection light from the first and second objective lenses 33a and 33b of the dual FOV optical system 30, the images of the first and second alignment marks may be recognized at the same time at which the parallelism between the first and second alignment marks is measured in the same area.

According to embodiments, the calibrator 50 as a reference is provided in the mounting device 1 in order to correct a change over time in the dual FOV optical system 30. The dual FOV optical system 30 may obtain optical parameters in advance in order to calculate a position of an object from a captured image. However, when heat or mechanical stress is applied, the optical elements of the dual FOV optical system 30 may deform over time. An error of the optical parameter of the dual FOV optical system 30 may be added as an error in calculating the position of the object. Accordingly, by arranging the calibrator 50 on the bonding stage 20 and periodically recognizing the calibrator 50 as an image, a change in optical parameter of the dual FOV optical system 30 may be corrected. Accordingly, an error caused by deformation of the dual FOV optical system 30 may be prevented or reduced.

While the disclosure has been particularly shown and described with reference to example embodiments thereof, it will be understood that various changes in form and details may be made therein without departing from the spirit and scope of the disclosure.

What is claimed is:

1. A mounting device comprising:
a bonding head configured to hold a first object;
a bonding stage configured to hold a second object;

a dual field-of-view (FOV) camera comprising an image sensor configured to simultaneously capture an image of a first alignment mark on the first object and an image of a second alignment mark on the second object to obtain a first image; and a calibrator, comprising an upper plane and a lower plane facing each other, configured to serve as a reference for optical characteristics of lenses of the dual FOV camera, wherein at least one of the bonding head and the bonding stage is configured to adjust a relative position between the first object and the second object based on the first image, and bond the first object to the second object.

2. The mounting device of claim 1, wherein the dual FOV camera further comprises:

a case in which the lenses are included;

a fiducial mark fixed in the case; and a switch configured to allow the image sensor to obtain an image of the fiducial mark at a predetermined time point, and wherein the lenses of the dual FOV camera are configured to form the first image with respect to the first alignment mark and the second alignment mark on the image sensor.

3. The mounting device of claim 1, further comprising an inclination sensor configured to detect inclination of the dual FOV camera, wherein the dual FOV camera further comprises a first driver configured to adjust the inclination of the dual FOV camera.

4. The mounting device of claim 1, further comprising a tilt sensor configured to detect parallelism between a first bonding surface of the first object and a second bonding surface of the second object, wherein at least one of the bonding head and the bonding stage comprises a second driver configured to adjust the relative position between the first object and the second object and the parallelism between the first bonding surface of the first object and the second bonding surface of the second object.

5. The mounting device of claim 4, wherein the lenses are configured to form the first image with respect to the first alignment mark and the second alignment mark on the image sensor, and wherein the tilt sensor comprises a photodiode configured to use a detection light passing through at least one of the lenses.

6. The mounting device of claim 5, wherein an illumination light used to form the first image with respect to the first alignment mark and the second alignment mark has a wavelength that is different from that of the detection light, and wherein the lenses comprise a dichroic mirror configured to combine or divide the illumination light and the detection light.

7. The mounting device of claim 1, wherein the lenses are configured to form the image of the first alignment mark and the image of the second alignment mark on the image sensor, and wherein the dual FOV camera is configured to detect a change over time in optical characteristics of the lenses by using the calibrator.

8. The mounting device of claim 7, wherein the calibrator has a pair of calibration patterns arranged on the upper plane and the lower plane, and wherein a distance and parallelism between the upper plane and the lower plane and a relative position between the pair of calibration patterns are predetermined.

9. The mounting device of claim 8, wherein the calibrator is fixed to the bonding stage, and wherein the dual FOV camera is configured to detect a change over time in optical characteristics of the lenses by using the calibrator while the bonding head holds the first object.

10. The mounting device of claim 1, wherein a first direction of the first alignment mark viewed from the dual FOV camera and a second direction of the second alignment mark viewed from the dual FOV camera are set to be the same as the first direction and the second direction on the image sensor.

11. A mounting method comprising:

holding a first object by a bonding head;

holding a second object by a bonding stage;

simultaneously capturing an image of a first alignment mark on the first object and an image of a second alignment mark on the second object by an image sensor of a dual field-of-view (FOV) camera to obtain a first image;

adjusting a relative position between the first object and the second object by moving at least one of the bonding head and the bonding stage based on the first image;

detecting a change over time in optical characteristics of lenses of the FOV camera by using a calibrator that includes an upper plane and a lower plane facing each other and configured to serve as a reference for optical characteristics of the lenses; and bonding the first object to the second object.

12. The mounting method of claim 11, further comprising:

detecting parallelism between a first bonding surface of the first object and a second bonding surface of the second object by a tilt sensor; and adjusting the parallelism by at least one second driver provided in at least one of the bonding head and the bonding stage.

13. The mounting method of claim 12, wherein the lenses are configured to form the first image with respect to the first alignment mark and the second alignment mark on the image sensor, and wherein the tilt sensor comprises an autocollimator using a detection light passing through at least one of the lenses.

14. The mounting method of claim 11, wherein a first direction of the first alignment mark viewed from the dual FOV camera and a second direction of the second alignment mark viewed from the dual FOV camera are set to be the same as the first direction and the second direction on the image sensor.

15. A mounting device comprising:

a bonding head configured to hold a first object;

a bonding stage configured to hold a second object;

a dual field-of-view (FOV) camera comprising an optical device comprising an image sensor configured to capture an image of the first object and an image of the second object; and a calibrator, comprising an upper plane and a lower plane facing each other, configured to serve as a reference for optical characteristics of lenses of the dual FOV camera, wherein at least one of the bonding head and the bonding stage is configured to adjust a relative position between the first object and the second object based on the images of the first object and the second object, and wherein at least one fiducial mark is formed in the optical device at a position where an image of the fiducial mark is always captured by the image sensor when the image sensor captures the images of the first object and the second object, wherein the dual FOV camera is configured to be inserted between the upper plane and the lower plane of the calibrator.

16. The mounting device of claim 15, further comprising at least one driver configured to move at least one of the bonding head and the bonding stage, wherein the image of the first object comprises an image of a first alignment mark on the first object, and the image of the second object comprises an image of a second alignment mark on the second object, and wherein the driver is configured to adjust misalignment between the first object and the second object based on the images of the first alignment mark and the second alignment mark and the image of the fiducial mark.

17. The mounting device of claim 16, wherein the fiducial mark comprises a first fiducial mark for a first FOV of the dual FOV camera and a second fiducial mark for a second FOV.

18. The mounting device of claim 16, further comprising a laser light source configured to generate a backlight by which the image sensor captures the image of the fiducial mark.

19. The mounting device of claim 16, further comprising an inclination sensor configured to detect an amount of inclination of a posture of the dual FOV camera, wherein the driver is configured to adjust misalignment between the first object and the second object further based on the detected amount of the inclination of the posture of the dual FOV camera.

20. The mounting device of claim 16, wherein the dual FOV camera is configured to be inserted between the first object and the second object facing each other, wherein the image sensor is configured to simultaneously capture the images of the first object and the second object, and wherein the image sensor is configured to capture the image of the fiducial mark before capturing the images of the first object and the second object.

* * * * *